(12) United States Patent
Abu-Rahma et al.

(10) Patent No.: US 7,882,407 B2
(45) Date of Patent: Feb. 1, 2011

(54) ADAPTING WORD LINE PULSE WIDTHS IN MEMORY SYSTEMS

(75) Inventors: Mohamed Hassan Abu-Rahma, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 176 days.

(21) Appl. No.: 12/328,156

(22) Filed: Dec. 4, 2008

(65) Prior Publication Data

US 2009/0158101 A1    Jun. 18, 2009

Related U.S. Application Data

(60) Provisional application No. 61/014,257, filed on Dec. 17, 2007.

(51) Int. Cl.
*G11C 29/00* (2006.01)
*G01R 31/30* (2006.01)

(52) U.S. Cl. .................. 714/718; 714/745; 365/201

(58) Field of Classification Search .............. 714/710, 714/711, 723, 701, 721, 745, 718
See application file for complete search history.

(56) References Cited

U.S. PATENT DOCUMENTS

| | | | |
|---|---|---|---|
| 6,161,204 A * | 12/2000 | Gans | 714/718 |
| 6,341,093 B1 | 1/2002 | Eckert et al. | |
| 6,366,507 B1 | 4/2002 | Akioka et al. | |
| 6,445,627 B1 | 9/2002 | Nakahara et al. | |
| 6,856,574 B2 | 2/2005 | Iwahashi et al. | |
| 6,865,705 B2 * | 3/2005 | Tomizawa et al. | 714/727 |
| 7,355,902 B2 | 4/2008 | Bhushan et al. | |
| 7,606,097 B2 * | 10/2009 | Jung et al. | 365/207 |
| 7,760,565 B2 * | 7/2010 | Kuang et al. | 365/201 |
| 2009/0063912 A1 | 3/2009 | Adams et al. | |

OTHER PUBLICATIONS

International Search Report—PCT/US08/086834, International Search Authority—European Patent Office—May 8, 2009.
Written Opinion—PCT/US08/086834, International Search Authority—European Patent Office—May 8, 2009.

* cited by examiner

*Primary Examiner*—James C Kerveros
(74) *Attorney, Agent, or Firm*—Sam Talpalatsky; Nicholas J. Pauley; Jonathan T. Velasco

(57) ABSTRACT

A memory system and method using adaptive word line (WL) pulse widths, including a memory operating according to a wordline (WL) pulse with an associated WL pulse width, and a built-in self-test (BIST) unit that interfaces with the memory, the BIST unit being configured to run a self-test of the internal functionality of the memory and provide a signal indicating if the memory passed or failed the self-test. An adaptive WL control circuit that interfaces with the BIST unit and the memory, the adaptive WL control circuit being configured to adjust the WL pulse width of the memory based on the signal provided by the BIST unit.

38 Claims, 5 Drawing Sheets

ADAPTING WORD LINE PULSE WIDTHS IN MEMORY SYSTEMS

CLAIM OF PRIORITY UNDER 35 U.S.C. §119

The present Application for Patent claims priority to Provisional Application No. 61/014,257 entitled "APPARATUS AND METHOD FOR ADAPTING WORD LINE PULSE WIDTHS IN MEMORY SYSTEMS" filed Dec. 17, 2007, and assigned to the assignee hereof and hereby expressly incorporated by reference herein.

FIELD OF DISCLOSURE

Embodiments of the invention are related to memory systems. More particularly, embodiments of the invention are related to adapting word line pulse widths used in memory systems.

BACKGROUND

As CMOS technology is continually scaled to smaller dimensions, process variations due to process control limitations as well as fundamental physical limits tend to increase. Embedded memories such as embedded SRAM are particularly susceptible to large process variations because of aggressive design rules and their small size compared to other digital logic. To deal with this large increase in process variations, memory circuit designers typically use overly conservative design approaches in order to achieve high parametric and functional yield.

For example, a designer may trade-off performance (e.g., speed) and/or power consumption for yield by designing a particular integrated circuit (IC) to function over a broad range of process variations, including both local (within each IC) and global (among ICs) variation. This results in a larger percentage of the ICs produced being operational (i.e., increased yield), but the sacrifices in performance and/or power consumption may be substantial in those ICs that are not subjected to the full range of process variations. Due to the statistical nature of process variations, the actual number of ICs experiencing substantial performance and/or power consumption degradation may be quite high.

FIG. 1 is a schematic diagram illustrating a conventional memory system 100 that reads/writes data in accordance with a word line (WL) pulse. The memory system 100 includes a memory 110, a built-in self-test (BIST) circuit 120, and a pulse width set module 130. BIST 120 tests all or a portion of the internal functionality of memory 110. Pulse width set module 130 sets the WL pulse width to be used for the read/write cycles in memory 110. Pulse width set module 130 may receive an external n-bit code from a system controller, or the like, indicating the desired WL pulse width.

As is well known in the art, the WL pulse width determines the length of time each read or write operation requires to complete, which directly affects both the performance and the power consumption of that memory. In general, an increased WL pulse width ensures a more accurate read/write operation, but operates more slowly and requires more power. In contrast, a decreased WL pulse width may be less accurate, especially over a broad range of process variations, but can operate faster and requires less power. Thus, setting the desired WL pulse width is often a design trade-off between memory performance and yield.

When a batch of ICs implementing memory system 100 is produced, one of the conventional post-fabrication techniques used to optimize memory performance and increase yield is to use post-silicon digital trimming. Typically, the external digital code used to control the WL pulse width (WL pulse width code) is set to achieve the target yield for a certain memory. Measurements are performed on a large sample of memories, and yield is determined for different WL pulse widths. The optimum WL pulse width is determined based on the target yield and is fixed for all the memories.

This approach has several limitations. One limitation is that the WL pulse width is fixed for all ICs based on extreme process variations. As discussed above, many if not most of the ICs do not experience such extreme process variation. Therefore, large performance loss and additional power consumption may affect a majority of ICs produced. Another limitation is that large testing time is required to measure the large sample sizes needed to accurately determine the value of the optimum WL pulse width for a given target yield.

SUMMARY

Exemplary embodiments of the invention are directed to systems, circuits and methods for adapting WL pulse widths used in memory systems.

One embodiment of the invention is directed to an apparatus comprising a memory system. The memory system comprises: a memory operating according to a wordline (WL) pulse with an associated WL pulse width; a built-in self-test (BIST) unit that interfaces with the memory, the BIST unit being configured to run a self-test of the internal functionality of the memory and provide a signal indicating if the memory passed or failed the self-test; and an adaptive WL control circuit that interfaces with the BIST unit and the memory, the adaptive WL control circuit being configured to adjust the WL pulse width of the memory based on the signal provided by the BIST unit.

Another embodiment of the invention is directed to a method of adjusting a wordline (WL) pulse width in a memory system including a memory operating according to a WL pulse. The method comprises: performing a self-test on the memory system to test the internal functionality of the memory under the current WL pulse width; and adjusting the WL pulse width of the memory based on the results of the self-test using on-chip adaptive WL control circuitry.

Another embodiment of the invention is directed to an apparatus for adjusting a wordline (WL) pulse width in a memory system including a memory operating according to a WL pulse. The apparatus comprises: means for performing a self-test on the memory system to test the internal functionality of the memory under the current WL pulse width; and on-chip means for adjusting the WL pulse width of the memory based on the results of the self-test.

Another embodiment of the invention is directed to a computer readable medium including sets of instructions executable by a processor to adjust a wordline (WL) pulse width in a memory system including a memory operating according to a WL pulse. The computer readable medium comprises: a first set of instructions executable by the processor to perform a self-test on the memory system to test the internal functionality of the memory under the current WL pulse width; and a second set of instructions executable by the processor to adjust the WL pulse width of the memory based on the results of the self-test.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

As discussed in the background, the conventional approach to optimizing word line (WL) pulse widths for memory systems in a given batch of integrated circuits (ICs) accounts for a wide range of process variations by trading-off performance and/or power consumption in individual ICs to increase overall yield. However, this approach is typically overly conservative for many if not most of the memory systems in the ICs. To increase the performance and reduce the power consumption, while still maintaining and potentially increasing the overall yield, embodiments of the invention adjust the WL pulse width for each IC individually. Whereas conventional approaches restrict the WL pulse width in each IC to a conservative value based on average measurements for the group of ICs, embodiments of the invention allow the WL pulse width to be adapted to each IC individually in order to optimize performance and power consumption in view of the actual process variations experienced by that IC.

Figure 1:
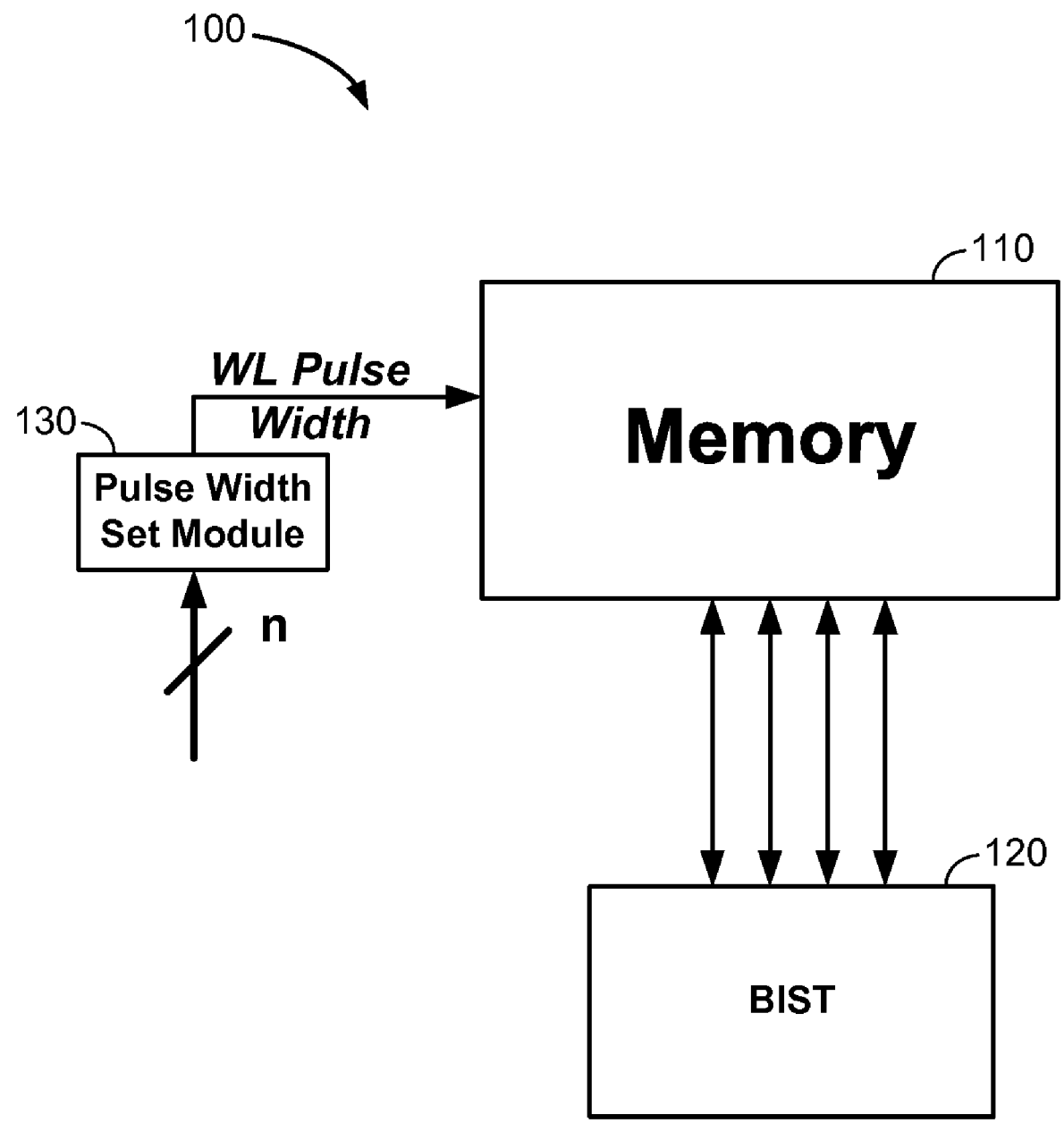
FIG. 1 is a schematic diagram illustrating a conventional memory system that reads/writes data in accordance with a word line (WL) pulse.
Figure 2:
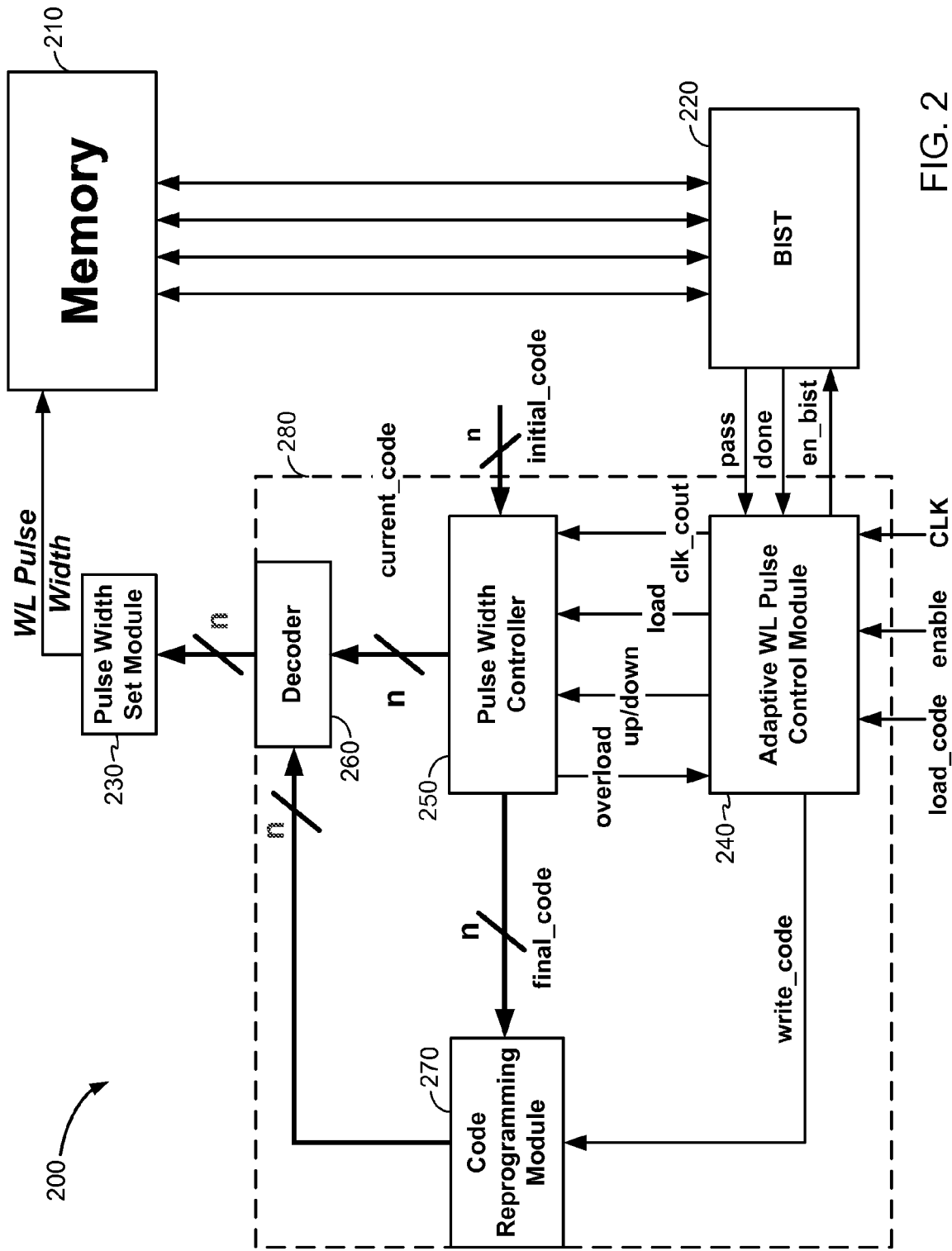
FIG. 2 illustrates a memory system.

FIG. 2 illustrates a memory system 200 according to an embodiment of the invention. Memory system 200 includes a memory 210, a built-in self-test (BIST) circuit 220, and a pulse width set module 230, similar to the conventional memory 100 described in the background. However, memory system 200 adds an adaptive WL pulse control module 240, a pulse width controller 250, a decoder 260, and a code reprogramming module 270, which interface with the pre-existing conventional memory system infrastructure, including memory 210, BIST 220, and pulse width set module 230, to form an adaptive WL control loop 280 that individually controls the WL pulse width for each memory in one or more ICs, as will be described below in more detail.

Adaptive WL pulse control module 240 interfaces directly with BIST 220, pulse width controller 250, and code reprogramming module 270 using a series of control signals. As illustrated in FIG. 2, adaptive WL pulse control module 240 receives a load_code signal, an enable signal, and a CLK signal from a system controller or the like (not shown). The load_code signal indicates that the initial WL pulse width code is to be loaded. The enable signal instructs adaptive WL pulse control module 240 to begin an optimum WL pulse width determination procedure. The CLK signal simply provides adaptive WL pulse control module 240 with the system clock.

Adaptive WL pulse control module 240 sends an en_bist signal to BIST 220 instructing BIST 220 to perform a self-test on memory 210. The en_bist may simply be implemented as a single bit, with a '1' instructing BIST 220 to perform the self-test and a '0' instructing BIST 220 not to perform the self-test, for example, or by using a more elaborate scheme. In response, BIST 220 sends a pass signal and a done signal to adaptive WL pulse control module 240. The pass signal indicates whether memory 210 passed the self-test (i.e., memory 210 is satisfactorily operational), or whether memory 210 failed the self-test (i.e., memory 210 is not satisfactorily operational). The pass signal may simply be implemented as a single bit, with a '1' indicating a 'pass' and a '0' indicating a 'fail,' for example, or by using a more elaborate scheme. The done signal indicates that BIST 220 has finished performing the self-test on memory 210. The done signal may simply be implemented as a single bit, with a '1' indicating the self-test is finished and a '0' indicating the self-test is not finished, for example, or by using a more elaborate scheme.

Adaptive WL pulse control module 240 communicates with pulse width controller 250 by sending a load signal and an up/down signal. The load signal instructs pulse width controller 250 to load the initial WL pulse width code. The initial WL pulse width code may be provided to pulse width controller 250 by the system controller, for example. The initial WL pulse width code value may be determined based on simulations, for example, taking into account the range of process variations, etc. Because the initial WL pulse width code may indicate a WL pulse width that may not be initially optimum (i.e., either too large or too small), the up/down signal instructs pulse width controller 250 to increase or decrease the WL pulse width code from the initial value. The up/down signal may simply be implemented as a single bit, with a '1' instructing pulse width controller 250 to increase the WL pulse width code value and a '0' instructing pulse width controller 250 to decrease the WL pulse width code value, for example, or by using a more elaborate scheme. In addition, adaptive WL pulse control module 240 also provides pulse width controller 250 with a clock clk_cout signal. The clk_cout signal may be a down converted version of the CLK signal, for example, to facilitate pulse width controller 250 incrementing or decrementing the WL pulse width code.

Adaptive WL pulse control module 240 also receives an overload signal from pulse width controller 250 indicating whether the WL pulse width code has been increased to its maximum value or decreased to its minimum value. The overload signal may simply be implemented as a single bit, with a '1' indicating that a maximum or minimum has been reached and a '0' indicating that a maximum or minimum has not been reached, for example, or by using a more elaborate scheme, such as a two bit signal with a '10' indicating a maximum has been reached, a '01' indicating a minimum has been reached, and a '00' indicating a maximum or minimum has not been reached.

When a final code has been selected, pulse width controller 250 outputs that final code to code reprogramming module 270 and adaptive WL pulse control module 240 sends a write_code signal to code reprogramming module 270 instructing code reprogramming module 270 to program the optimized final WL pulse width code into a memory contained therein. The write_code may simply be implemented as a single bit, with a '1' instructing code reprogramming module 270 to program the final code and a '0' instructing code reprogramming module 270 not to program the final code, for example, or by using a more elaborate scheme. The code reprogramming module 270 allows for the dynamic real-time reprogramming of memory system 100, and for the permanent storage of the optimized final WL pulse width code. In some applications, the memory in code reprogramming module 270 may be a non-volatile memory capable of storing the optimized final WL pulse code indefinitely. For example, code reprogramming module 270 may be implemented with an eFUSE memory or any other well known programmable non-volatile memory. However, in other applications it may be desirable to optimize the WL pulse code each time the IC is powered on. In such applications, a volatile memory may be used.

Decoder 260 receives the WL pulse width code from either pulse width controller 250 during WL pulse width determination, or from code reprogramming module 270 once the WL pulse width code has been finalized. Because the WL pulse width codes may not necessarily have a monotonic relationship to actual WL pulse widths, decoder 260 is used to map or decode each WL pulse width code so that the output WL pulse width from pulse width set module 230 increases/decreases monotonically with the pre-decoded WL pulse width code. Pulse width set module 230 in turn sets the WL pulse width used for reading from or writing to memory 210.

It will be appreciated by one of ordinary skill in the art that decoder 260 allows adaptive WL control loop 280 to search the potential WL pulse width codes for an optimized code without keeping track of which codes have been searched by searching in a single increasing/decreasing direction. However, the use of decoder 260 is not intended to limit the scope of various embodiments of the invention, which may alternatively use a memory or the like to keep track of which codes have been tested.

Figure 3:
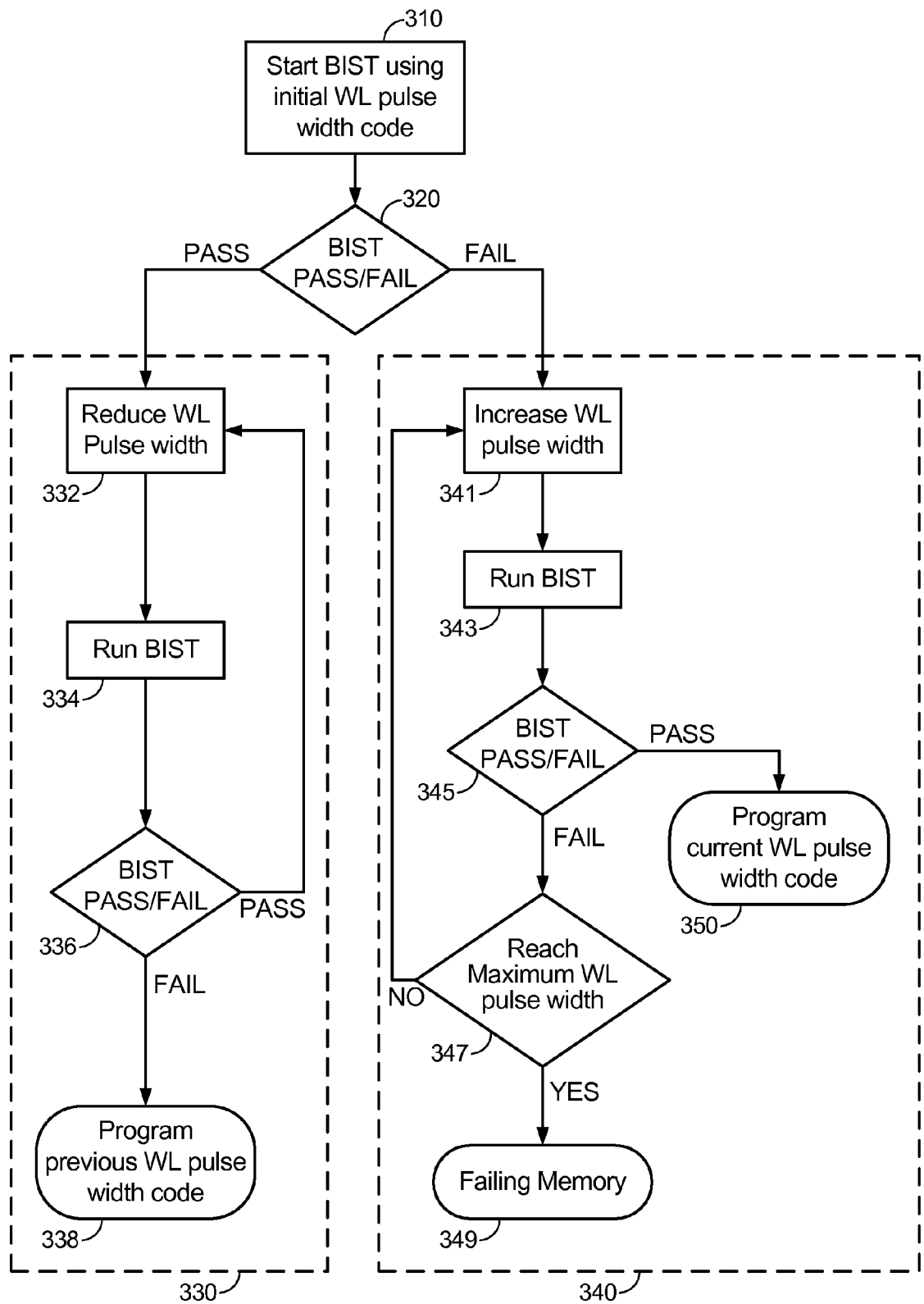
FIG. 3 is a flow diagram illustrating the operation of an adaptive WL control loop.

FIG. 3 is a flow diagram illustrating the operation of an adaptive WL control loop according to an embodiment of the invention. The operation of optimizing the WL pulse width of memory system 200 will now be described below with reference to FIGS. 2 and 3, and with reference to the control signals described above.

According to embodiments of the invention, each IC independently sets its own WL pulse width. This may be done, for example, on initial power-up, or whenever needed. For example, well known age-dependent, memory degradation effects, such as hot carrier effects, negative bias temperature instability (NBTI) effects, etc., may reduce the performance of the memory over time. It may be desirable, therefore, to adjust the WL pulse width of the memory according to embodiments of the invention not only initially, but also subsequently to optimize memory operation in light of degraded IC characteristics.

Once the system controller enables the adaptive WL control loop 280 using the enable signal, it instructs adaptive WL pulse control module 240 to load the initial WL pulse width code using the load_code signal. Adaptive WL pulse control module 240 in turn instructs pulse width controller 250 to load the initial WL pulse width code using the load signal. Pulse width controller 250 outputs the initial WL pulse width code to decoder 260, which subsequently sets the WL pulse width to the initial value through pulse width set module 230.

Once the WL pulse width is set, adaptive WL pulse control module 240 instructs BIST 220 to perform a self-test on memory 210 using the en_bist signal (block 310). BIST 220 performs the self-test and indicates completion to the adaptive WL pulse control module 240 using the done signal. BIST 220 also passes the results of the self-test to adaptive WL pulse control module 240 using the pass signal (block 320).

If a pass is indicated by the pass signal, the IC is at least meeting minimum design specifications. Accordingly, adaptive WL pulse control module 240 will attempt to increase performance and reduce power consumption of this particular IC. To do so, adaptive WL pulse control module 240 enters an optimization mode (block group 330). In this mode, adaptive WL pulse control module 240 instructs pulse width controller 250 to decrease the WL pulse width code using the up/down signal (block 332). Decreasing the WL pulse width code, and correspondingly the WL pulse width, may allow the IC to function with increased performance and reduced power consumption. The current WL pulse width is applied to memory 210 from the current WL pulse width code in the manner described above for the initial WL pulse width code.

Once the WL pulse width has been updated, adaptive WL pulse control module 240 instructs BIST 220 to perform a subsequent self-test on memory 210 using the en_bist signal to test if memory 210 is operational under the current WL pulse width value (block 334). As before, BIST 220 performs the self-test and indicates completion to the adaptive WL pulse control module 240 using the done signal. BIST 220 also passes the results of the self-test to adaptive WL pulse control module 240 using the pass signal (block 336). If memory 210 passes this subsequent self-test, it is still operational even under the increased functional requirements arising from the decreased WL pulse width. Adaptive WL pulse control module 240 will then attempt to increase performance and reduce power consumption further by repeating the above operations (blocks 332 through 336) in an iterative manner until memory 210 fails a subsequent self-test.

Once a fail is indicated by a subsequent self-test, the operational limits of memory 210 have been reached. Accordingly, adaptive WL pulse control module 240 instructs code reprogramming module 270 using the write_code signal to program the last WL pulse width code that resulted in a passing self-test (i.e., the previous WL pulse width code in this mode) (block 338). If the minimum WL pulse width code is reached, pulse width controller 250 will alert adaptive WL pulse control module 240 of this using the overload signal. If memory 210 still passes the subsequent self-test with the minimum WL pulse width, the minimum WL pulse width code will be programmed into code reprogramming module 270.

Accordingly, by entering the optimization mode, an adaptive WL control loop according to embodiments of the invention may potentially increase the performance and reduce the power consumption of a particular IC.

Returning now to the initial BIST pass/fail (block 320), if a fail is indicated by the pass signal, the IC is not meeting the minimum design specifications. In conventional memory system 100, this would mean that this particular IC is defective and would have to be discarded. However, according to embodiments of the invention, this particular IC may yet be salvaged. For example, the BIST failure may potentially be mitigated by increasing the read margin (i.e., increasing the WL pulse width). To do so, adaptive WL pulse control module 240 enters a recovery mode (block group 340). In this mode, adaptive WL pulse control module 240 instructs pulse width controller 250 to increase the WL pulse width code using the up/down signal (block 341). Increasing the WL pulse width code, and correspondingly the WL pulse width, may allow the IC to stably function, albeit at reduced performance and with a higher power consumption. The current WL pulse width is applied to memory 210 from the current WL pulse width code in the manner described above for the initial WL pulse width code.

Once the WL pulse width has been updated, adaptive WL pulse control module 240 instructs BIST 220 to perform a subsequent self-test on memory 210 using the en_bist signal to test if memory 210 is operational under the current WL pulse width value (block 343). As before, BIST 220 performs the self-test and indicates completion to the adaptive WL pulse control module 240 using the done signal. BIST 220 also passes the results of the self-test to adaptive WL pulse control module 240 using the pass signal (block 345). If memory 210 fails this subsequent self-test, it is still not operational even under the decreased functional requirements arising from the increased WL pulse width. As long as the maximum allowable WL pulse width has not been reached (block 347), adaptive WL pulse control module 240 will then attempt to decrease the functional requirements even further by repeating the above operations (blocks 341 through 345) in an iterative manner until memory 210 passes a subsequent self-test.

Once a pass is indicated by the subsequent self-tests, the operational limits of memory 210 have been reached. Accordingly, adaptive WL pulse control module 240 instructs code reprogramming module 270 using the write_code signal to program the last WL pulse width code that resulted in a passing self-test (i.e., the current WL pulse width code in this mode) (block 350). If the maximum WL pulse width code is reached and memory 210 still fails the subsequent self-test, pulse width controller 250 will alert adaptive WL pulse control module 240 of this using the overload signal (block 347). In this case, this particular memory has failed recovery and is considered inoperable (block 349).

Accordingly, by entering the recovery mode, a memory system according to embodiments of the invention may potentially increase yield by recovering ICs that do not meet the minimum original design requirements but are still able to function under reduced requirements that provide some level of acceptable operation.

Once the final WL pulse width code is programmed, the system enable signal may be deactivated and the adaptive WL control loop 280 disabled. At this point, the optimized final WL pulse width code is stored in code reprogramming module 270 and passed to decoder 260 for use in memory 210.

It will be appreciated by one of ordinary skill in the art that the incremental searching algorithm described above is shown for illustrative purposes, and is not intended to limit the range of searching algorithms that may be implemented according to various embodiments of the invention. For example, a tree searching algorithm, a random searching algorithm, or other searching algorithms that are well known in the art may also be used according to various embodiments of the invention.

Figure 4:
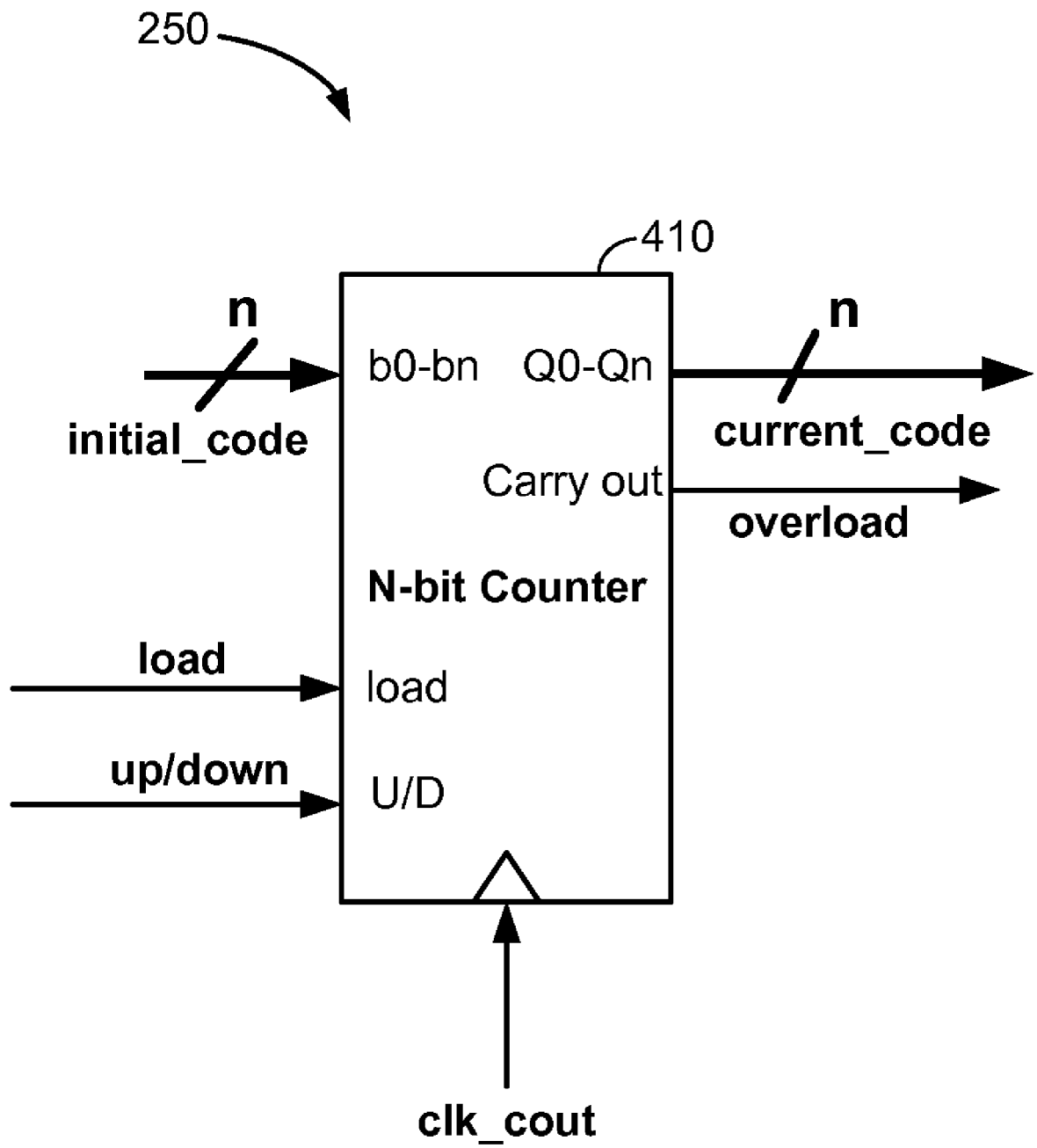
FIG. 4 illustrates an example implementation of the pulse width controller of FIG. 2 using an n-bit counter.

FIG. 4 illustrates an example implementation of the pulse width controller of FIG. 2 using an n-bit counter.

As shown, an n-bit counter 410 receives a load signal, an up/down signal, and a clk_cout signal. As described above with reference to FIG. 2, these control signals may be outputted from adaptive WL pulse control module 240. N-bit counter 410 also receives an n-bit initial WL pulse width code from a system controller or the like. N-bit counter 410 outputs an n-bit current WL pulse width code and an overload signal. As described above with reference to FIG. 2, the overload signal may be received by adaptive WL pulse control module 240, and the n-bit current WL pulse width code may be received by decoder 260 and/or code reprogramming module 270.

N-bit counter 410 includes circuitry for increasing and decreasing the initial WL pulse width code in accordance with the operations described above with reference to FIGS. 2 and 3. When a load signal is received, n-bit counter 410 loads the initial WL pulse width code values b0 through bn into a series of bit storage devices (e.g., flip-flops). When an up/down signal is received, n-bit counter 410 increments or decrements the stored WL pulse width code in accordance with the clk_cout signal using counter circuitry that is well known in the art, and a further description of which will be omitted here.

Once the current WL pulse width code has been updated, it is output as current WL pulse width code values Q0-Qn that may be used to adjust the WL pulse width, etc. The counting operation also keeps track of any generated overflow bits from the calculations. The overflow bits are output using the overload signal to indicate that a maximum or minimum value has been reached. As discussed above, this is useful in determining if a maximum or minimum functionality has been reached.

The techniques described herein may be used for various electronics devices such as wireless communication devices, handheld devices, gaming devices, computing devices, computers, laptop computers, consumer electronic devices, etc. An exemplary use of the techniques for a wireless communication device is described below.

Figure 5:
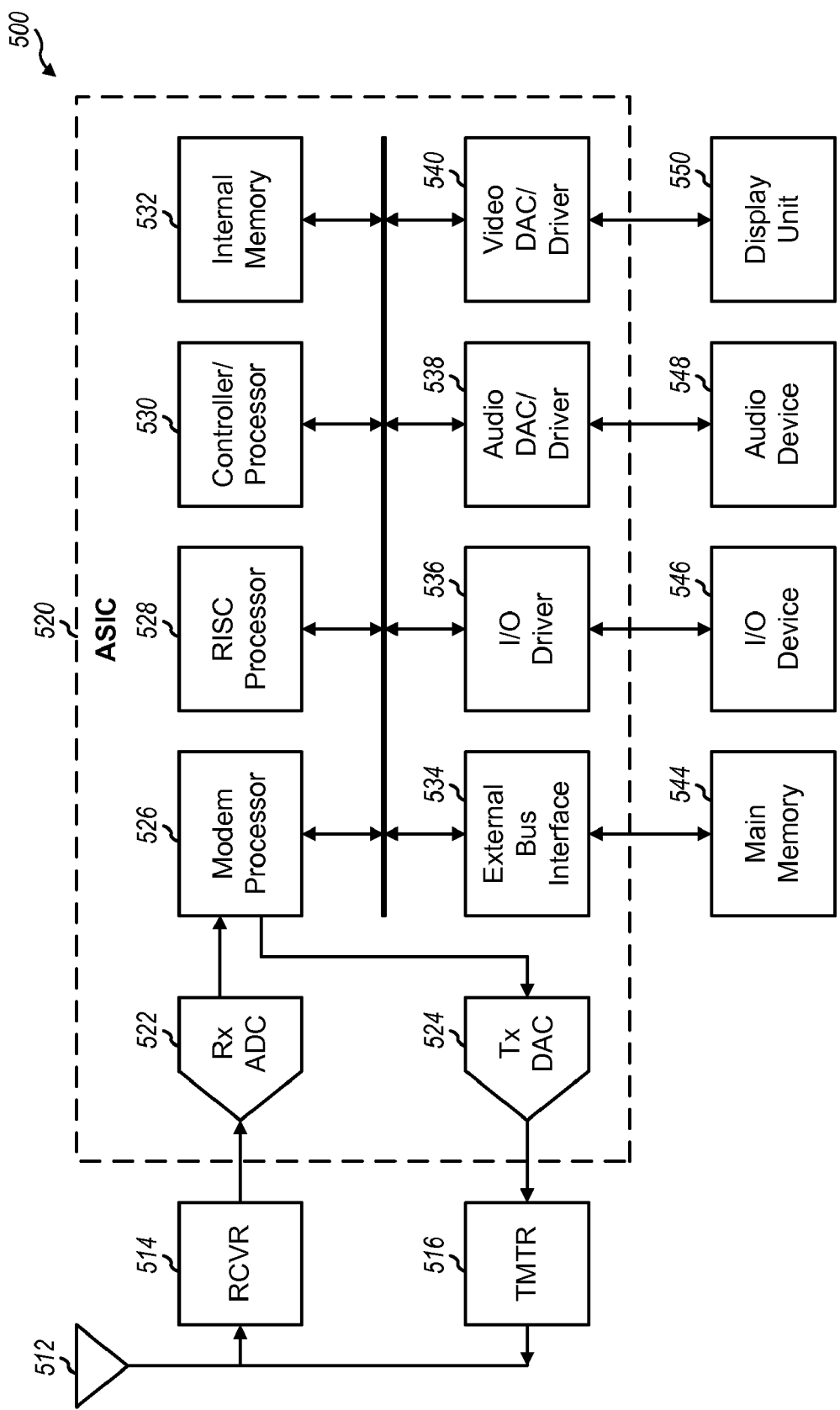
FIG. 5 shows a block diagram of a design of a wireless communication device in a wireless communication system.

FIG. 5 shows a block diagram of a design of a wireless communication device 500 in a wireless communication system. Wireless device 500 may be a cellular phone, a terminal, a handset, a personal digital assistant (PDA), etc. The wireless communication system may be a Code Division Multiple Access (CDMA) system, a Global System for Mobile Communications (GSM) system, etc.

Wireless device 500 is capable of providing bi-directional communication via a receive path and a transmit path. On the receive path, signals transmitted by base stations (not shown) are received by an antenna 512 and provided to a receiver (RCVR) 514. Receiver 514 conditions the received signal and provides an analog input signal to an application specific integrated circuit (ASIC) 520. On the transmit path, a transmitter (TMTR) 516 receives and conditions an analog output signal from ASIC 520 and generates a modulated signal, which is transmitted via antenna 512 to the base stations.

ASIC 520 may include various processing, interface, and memory units such as, e.g., a receive ADC (Rx ADC) 522, a transmit DAC (Tx DAC) 524, a modem processor 526, a reduced instruction set computing (RISC) processor 528, a controller/processor 530, an internal memory 532, an external bus interface 534, an input/output (I/O) driver 536, an audio DAC/driver 538, and a video DAC/driver 540. Rx ADC 522 digitizes the analog input signal from receiver 514 and provides samples to modem processor 526. Tx DAC 524 converts output chips from modem processor 526 from digital to analog and provides the analog output signal to transmitter 516. Modem processor 526 performs processing for data transmission and reception, e.g., encoding, modulation, demodulation, decoding, etc. RISC processor 528 may perform various types of processing for wireless device 500, e.g., processing for video, graphics, higher layer applications, etc. Controller/processor 530 may direct the operation of various processing and interface units within ASIC 520. Internal memory 532 stores data and/or instructions for various units within ASIC 520.

EBI 534 facilitates transfer of data between ASIC 520 and a main memory 544. I/O driver 536 drives an I/O device 546 via an analog or digital interface. Audio DAC/driver 538 drives an audio device 548, which may be a speaker, a headset, an earpiece, etc. Video DAC/driver 540 drives a display unit 550, which may be a liquid crystal display (LCD), etc.

Internal memory 532, main memory 544, and/or other units may implement the techniques described herein. For example, any of the memories may be generated as shown in FIG. 2.

In view of the foregoing, it will be appreciated that embodiments of the invention can also include methods for performing the functions, sequence of actions and/or algorithms described herein. For example, a method of adapting WL pulse widths used in memory systems may be performed in accordance with the flow diagram illustrated in FIG. 3.

It will also be appreciated that the methods according to embodiments of the invention may be implemented in hardware and/or software. The hardware/software implementations may include a combination of processor(s) and article(s) of manufacture. For example, RISC processor 528 may be configured to implement the techniques for adapting WL pulse widths described herein to optimize the operation of internal memory 532 and/or main memory 544. The article(s) of manufacture may further include storage media and executable computer program(s), for example, a computer program product stored on a computer readable medium. The executable computer program(s) may include sets of instructions to perform the described operations or functions. It will be appreciated that as used herein a set of instructions may include one or more instructions.

Embodiments of the invention described above offer several advantages over conventional techniques. For example, the techniques described herein provide for the recovery of ICs that may not meet the original design specifications, and hence, provide for an increase in overall yield. Furthermore, the ICs that are produced do not assume worst-case-scenario process variations, resulting in a reduction of the WL pulse width that may improve performance and power consumption characteristics, as well as improve cell stability, for example, by reducing the probability of cell flip. Because of the tighter distribution of power consumption over the different ICs, there may be better prediction of total IC power. In addition, because a larger portion of the fabricated ICs may have lower power consumption, the average power consumption for all fabricated ICs may be reduced. The sense margin may also be reduced as long as the memory does not fail, which leads to a faster sense margin response. The sense margin may also be optimized for each memory individually as required for the memory to operate correctly. The impact on testing time is also negligible since the techniques described herein use the on-chip BIST to adapt the WL pulse width, which does not require additional external testing.

While the foregoing disclosure shows illustrative embodiments of the invention, it should be noted that various changes and modifications could be made herein without departing from the scope of the invention as defined by the appended claims. For example, it will be appreciated by one of ordinary skill in the art that the incremental searching algorithm described above is only one of many searching algorithms that may be implemented to find an optimized WL pulse width code. A tree searching algorithm, a random searching algorithm, or other searching algorithms that are well known in the art may also be used according to various embodiments of the invention. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising a memory system, the memory system comprising:
    a memory operating according to a wordline (WL) pulse with an associated WL pulse width;
    a built-in self-test (BIST) unit that interfaces with the memory, the BIST unit being configured to run a self-test of the internal functionality of the memory and provide a signal indicating if the memory passed or failed the self-test; and
    an adaptive WL control circuit that interfaces with the BIST unit and the memory, the adaptive WL control circuit being configured to adjust the WL pulse width of the memory within predetermined maximum and minimum allowed WL pulse width values based on the signal provided by the BIST unit.

2. The apparatus of claim 1, wherein the adaptive WL control circuit is configured to increase the WL pulse width if the signal provided by the BIST unit indicates that the memory failed the self-test and to decrease the WL pulse width if the signal provided by the BIST unit indicates that the memory passed the self-test.

3. The apparatus of claim 2, wherein the adaptive WL control circuit is further configured to instruct the BIST unit to perform subsequent self-tests of the internal functionality of the memory as the WL pulse width is increased or decreased until the result of the self-test changes from a pass to a fail or from a fail to a pass.

4. The apparatus of claim 3, wherein the adaptive WL control circuit is configured to set the WL pulse width of the memory to the WL pulse width value used immediately before the self-test changed from pass to fail.

5. The apparatus of claim 3, wherein the adaptive WL control circuit is configured to set the WL pulse width of the memory to the WL pulse width value used when the self-test changes from fail to pass.

6. The apparatus of claim 3, wherein the adaptive WL control circuit is configured to increase or decrease the WL pulse width from an initial value in the manner of a feedback loop by providing a new value determined based on the signal provided by the BIST unit.

7. The apparatus of claim 6, wherein the adaptive WL control circuit is configured to increment or decrement the WL pulse width.

8. The apparatus of claim 1, wherein the adaptive WL control circuit comprises:
    a first control circuit that interfaces with the BIST unit, the first control circuit being configured to determines whether to increase or decrease the WL pulse width of the memory based on the signal provided by the BIST unit and to provide a first control signal indicating determined adjustments to the WL pulse width; and
    a second control circuit that interfaces with the first control circuit, the second control circuit being configured to adjust the WL pulse width based on the first control signal provided by the first control circuit.

9. The apparatus of claim 8, wherein the first control circuit determines to increase the WL pulse width if the signal provided by the BIST unit indicates that the memory failed the self-test and to decrease the WL pulse width if the signal provided by the BIST unit indicates that the memory passed the self-test.

10. The apparatus of claim 8, wherein the second control circuit is further configured to provide an overload signal to the first control circuit indicating that the WL pulse width has reached the predetermined maximum or minimum allowed WL pulse width value.

11. The apparatus of claim 10, wherein the second control circuit is a counter configured to increment or decrement the WL pulse width value according to the first control signal provided by the first control circuit, and configured to provide the adjusted WL pulse width as the incremented/decremented value and provide the overload signal as the overflow bit of the increment/decrement operation.

12. The apparatus of claim 8, wherein the adaptive WL control circuit further includes a decoder that interfaces with the second control circuit, the decoder being configured to map the adjusted WL pulse width to allowable WL pulse widths of the memory in a monotonically increasing or decreasing manner.

13. The apparatus of claim 8, wherein the adaptive WL control circuit further includes a reprogramming module that interfaces with the first and second control circuits, the second control circuit being configured to provide the adjusted WL pulse width value to the reprogramming module, the first control circuit being configured to provide a write signal instructing the reprogramming module to store the adjusted WL pulse width value provided by the second control circuit, and the reprogramming module configured to provide non-volatile storage of the adjusted WL pulse width value.

14. The apparatus of claim 8, wherein the apparatus is a wireless communication device, the apparatus further comprising a system controller.

15. The apparatus of claim 14, wherein the system controller is configured to instruct the memory system to adjust the WL pulse width upon two or more power-ups of the wireless communication device.

16. The apparatus of claim 14, wherein the system controller is configured to instruct the memory system to adjust the WL pulse width periodically according to a given interval of time.

17. A method of adjusting a wordline (WL) pulse width in a memory system including a memory operating according to a WL pulse, the method comprising:
performing a self-test on the memory system to test the internal functionality of the memory under the current WL pulse width; and
adjusting the WL pulse width of the memory within predetermined maximum and minimum allowed WL pulse width values based on the results of the self-test using on-chip adaptive WL control circuitry.

18. The method of claim 17, wherein the adjusting includes increasing the WL pulse width if the memory fails the self-test and decreasing the WL pulse width if the memory passes the self-test.

19. The method of claim 18, further comprising:
repeating the performing and the adjusting until the result of the self-test changes from a pass to a fail or from a fail to a pass.

20. The method of claim 19, further comprising:
mapping the adjusted WL pulse width to allowable WL pulse widths of the memory in a monotonically increasing or decreasing manner.

21. The method of claim 19, further comprising:
setting the WL pulse width of the memory to the WL pulse width value used immediately before the self-test changed from pass to fail.

22. The method of claim 19, further comprising:
setting the WL pulse width of the memory to the WL pulse width value used when the self-test changes from fail to pass.

23. The method of claim 17, wherein the performing and adjusting operations are initiated upon two or more power-ups of the memory system.

24. The method of claim 17, wherein the performing and adjusting operations are initiated periodically according to a given interval of time.

25. An apparatus for adjusting a wordline (WL) pulse width in a memory system including a memory operating according to a WL pulse, the apparatus comprising:
means for performing a self-test on the memory system to test the internal functionality of the memory under the current WL pulse width; and
on-chip means for adjusting the WL pulse width of the memory within predetermined maximum and minimum allowed WL pulse width values based on the results of the self-test.

26. The apparatus of claim 25, wherein the means for adjusting includes means for increasing the WL pulse width if the memory fails the self-test and means for decreasing the WL pulse width if the memory passes the self-test.

27. The apparatus of claim 26, further comprising:
means for repeating the performing and the adjusting until the result of the self-test changes from a pass to a fail or from a fail to a pass.

28. The apparatus of claim 27, further comprising:
means for mapping the adjusted WL pulse width to allowable WL pulse widths of the memory in a monotonically increasing or decreasing manner.

29. The apparatus of claim 27, further comprising:
means for setting the WL pulse width of the memory to the WL pulse width value used immediately before the self-test changed from pass to fail.

30. The apparatus of claim 27, further comprising:
means for setting the WL pulse width of the memory to the WL pulse width value used when the self-test changes from fail to pass.

31. A computer readable medium including sets of instructions executable by a processor to adjust a wordline (WL) pulse width in a memory system including a memory operating according to a WL pulse, the computer readable medium comprising:
a first set of instructions to perform a self-test on the memory system to test the internal functionality of the memory under the current WL pulse width; and
a second set of instructions to adjust the WL pulse width of the memory within predetermined maximum and minimum allowed WL pulse width values based on the results of the self-test.

32. The computer readable medium of claim 31, wherein the second set of instructions includes instructions executable by the processor to increase the WL pulse width if the memory fails the self-test and to decrease the WL pulse width if the memory passes the self-test.

33. The computer readable medium of claim 32, further comprising:
a third set of instructions to repeat the first and second sets of instructions until the result of the self-test changes from a pass to a fail or from a fail to a pass.

34. The computer readable medium of claim 33, further comprising:
a fourth set of instructions to map the adjusted WL pulse width to allowable WL pulse widths of the memory in a monotonically increasing or decreasing manner.

35. The computer readable medium of claim 33, further comprising:
  a fifth set of instructions to set the WL pulse width of the memory to the WL pulse width value used immediately before the self-test changed from pass to fail.

36. The computer readable medium of claim 33, further comprising:
  a sixth set of instructions to set the WL pulse width of the memory to the WL pulse width value used when the self-test changes from fail to pass.

37. The computer readable medium of claim 31, further comprising:
  a seventh set of instructions to run the first and second set of instructions upon two or more power-ups of the memory system.

38. The computer readable medium of claim 31, further comprising:
  an eighth set of instructions to run the first and second set of instructions periodically according to a given interval of time.

* * * * *

UNITED STATES PATENT AND TRADEMARK OFFICE
CERTIFICATE OF CORRECTION

| | |
|---|---|
| PATENT NO. | : 7,882,407 B2 |
| APPLICATION NO. | : 12/328156 |
| DATED | : February 1, 2011 |
| INVENTOR(S) | : Abu-Rahma et al. |

It is certified that error appears in the above-identified patent and that said Letters Patent is hereby corrected as shown below:

Column 10, line 48, claim 8: "configured to determines" to read as --configured to determine--

Signed and Sealed this
Thirtieth Day of August, 2011

David J. Kappos
*Director of the United States Patent and Trademark Office*